(12) United States Patent
Thevenot

(10) Patent No.: US 7,387,259 B2
(45) Date of Patent: Jun. 17, 2008

(54) HYBRID CARD

(75) Inventor: Benoît Thevenot, Olivet (FR)

(73) Assignee: Axalto S.A., Montrouge (FR)

( * ) Notice: Subject to any disclaimer, the term of this patent is extended or adjusted under 35 U.S.C. 154(b) by 0 days.

(21) Appl. No.: 10/528,306

(22) PCT Filed: Sep. 17, 2003

(86) PCT No.: PCT/IB03/04011

§ 371 (c)(1),
(2), (4) Date: Aug. 25, 2005

(87) PCT Pub. No.: WO2004/027863

PCT Pub. Date: Apr. 1, 2004

(65) Prior Publication Data

US 2006/0104041 A1 May 18, 2006

(30) Foreign Application Priority Data

| Sep. 17, 2002 | (EP) | ................................ | 02292278 |
| Sep. 17, 2002 | (EP) | ................................ | 02292279 |
| Sep. 24, 2002 | (EP) | ................................ | 02292344 |

(51) Int. Cl.
 *G06K 19/06* (2006.01)
(52) U.S. Cl. .................................................... 235/492
(58) Field of Classification Search ................ 235/492
See application file for complete search history.

(56) References Cited

U.S. PATENT DOCUMENTS

| 5,965,867 | A | 10/1999 | Haghiri-Tehrani | |
| 6,095,424 | A * | 8/2000 | Prancz | ........................ 235/492 |
| 6,179,210 | B1 | 1/2001 | Haas et al. | |
| 6,421,248 | B1 | 7/2002 | Mensch et al. | |
| 6,431,456 | B2 | 8/2002 | Nishizawa et al. | |
| 6,440,773 | B1 * | 8/2002 | Usami | ........................ 438/107 |
| 6,566,163 | B1 * | 5/2003 | Laroche et al. | ............. 438/106 |
| 6,568,600 | B1 * | 5/2003 | Carpier et al. | ............... 235/492 |
| 2001/0050138 | A1 * | 12/2001 | Fujikawa et al. | ......... 156/272.8 |
| 2003/0183914 | A1 * | 10/2003 | Wallace | ...................... 257/678 |

FOREIGN PATENT DOCUMENTS

| EP | 0 676 716 A | 10/1995 |
| EP | 0 818 752 A | 1/1998 |
| FR | 2 761 497 A | 10/1998 |

OTHER PUBLICATIONS

International Search Report dated Jun. 7, 2006 (6 pages).

* cited by examiner

*Primary Examiner*—Michael G. Lee
*Assistant Examiner*—Tae W Kim
(74) *Attorney, Agent, or Firm*—Osha Liang LLP

(57) ABSTRACT

A card like object comprises a card body comprising a first face. The first face is at least partially graphically personalized. An antenna is embedded in the card body. The card body is provided with a cavity. The cavity comprises a contact chip. The cavity further comprises a contactless chip, the contactless chip being electrically connected to the antenna with connecting means.

9 Claims, 1 Drawing Sheet

HYBRID CARD

FIELD OF THE INVENTION

The invention concerns hybrid cards. "Hybrid cards" stands here for cards including a chip with its ISO 7816 contact interface and a second chip with its ISO 14443 contactless interface.

BACKGROUND OF THE INVENTION

Generally hybrid cards are graphically personalized on their surface by means of, for example, dye thermal transfer printers. As illustrated in FIG. 1, conventional hybrid cards comprise a contactless chip and a contact chip.

The contactless chip (1) is connected to an antenna (2), either directly by means of the flip-chip technology, or indirectly if it is encapsuled into a module that is connected to the antenna by means of either welding, brazing or conductive adhesive based technologies. The antenna is a set of loops that may be either constituted of wound wires, either printed by way of additive or subtractive processes. The antenna and the contactless chip or contactless module are embedded in the card body (3).

The contact chip is connected to contact areas located as defined in the ISO 7816 standard. This chip is most generally encapsuled in a module (4).

SUMMARY OF THE INVENTION

An object of the invention is to both allow reducing of the costs and to obtain hybrid cards with an enhanced quality.

According to one aspect of the invention, a card like object comprising a card body comprising a first face, the first face being at least partially graphically personalized, an antenna being embedded in the card body, the card body being provided with a cavity, the cavity comprising a contact chip, is characterized in that the cavity further comprises a contactless chip, the contactless chip being electrically connected to the antenna with connecting means.

Conventional hybrid card manufacturing technologies do not fully comply with dye thermal transfer printing process due to the surface unevenness defect induced by the contactless chip or contactless module located in the thickness of the card body.

As a matter of fact, the difference between the coefficients of thermal expansion of the chip or the module and the plastic materials composing the card body causes a local non-homogeneity of the shrinkage that appears during the cooling step of the lamination process. As shown in FIG. 2, this non-homogeneity is itself responsible for a local unevenness defect (5) at the surface of the card. This surface defect causes a fading of the dye transfer printed colors.

Thanks to the invention, the contactless chip is not placed within the thickness of the cardbody. Only one cavity needs to be created in the cardbody. The manufacturing process is thus easier. In addition, the card body has less local non-homogeneity on its surface. The hybrid cards can therefore be graphically personalized with an enhanced quality using, for example, a dye thermal transfer printing process.

Finally the hybrid card according to the invention allows both reducing of the costs and obtaining hybrids cards with an enhanced quality.

DETAILED DESCRIPTION

Figure 1:
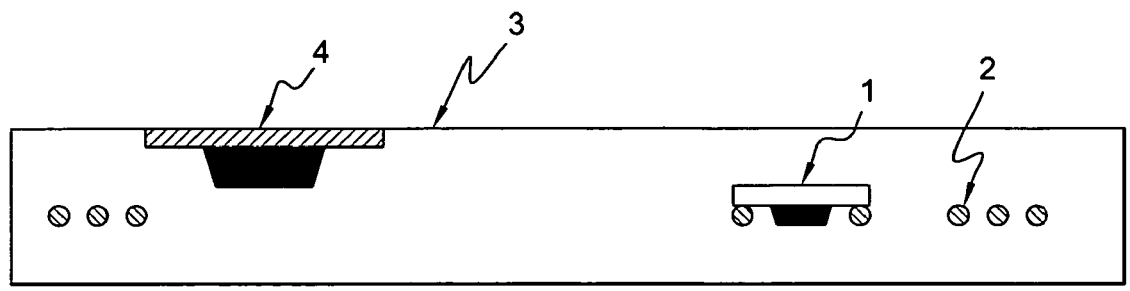
FIG. 1 illustrates a conventional hybrid card.
Figure 2:
FIG. 2 illustrates local non-homogeneities in a conventional hybrid card.
Figure 3:
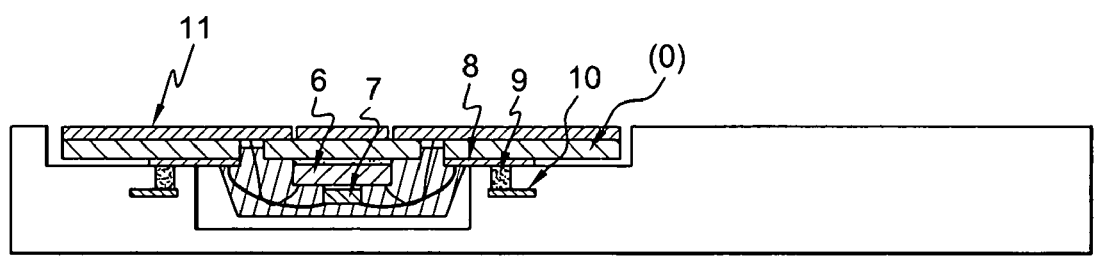
FIG. 3 illustrates a first embodiment according to the invention.

As illustrated in FIG. 3, a contact chip (6) is connected to the ISO 7816 contact areas (11) of a module (0) by means of bonded wires. A contactless chip (7) is stacked upon the contact chip (6) and is connected to conducting tracks (8) at the backside of the module (0) by means of bonded wires. The conductive tracks (8) are connected to antenna contact areas (10) by means of conducting adhesive filled holes (10).

Figure 4:
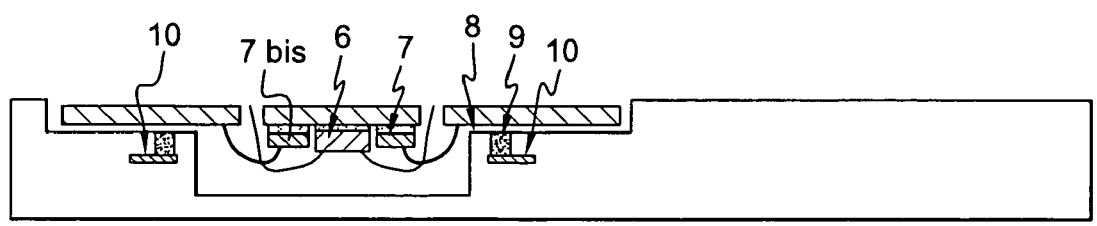
FIG. 4 illustrates a second embodiment according to the invention.

In an other embodiment, as illustrated in FIG. 4, the contact chip (6) is connected to the ISO 7816 contact areas of the module by means of bonded wires. Contactless chips (7) and (7 bis) are placed side-by-side with the contact chip (6) and are connected to the conducting tracks (8) at the backside of the module by means of bonded wires. The conducting tracks (8) are connected to antennas contact areas (10) by means of conductive adhesive filled holes (9).

The description hereinbefore describes a card like object comprising a card body comprising a first face, the first face being at least partially graphically personalized, an antenna being embedded in the card body, the card body being provided with a cavity, the cavity comprising a contact chip, wherein the cavity further comprises a contactless chip, the contactless chip being electrically connected to the antenna with connecting means.

The contact chip and the contactless chip can be stacked. But they can also be in a side-by-side configuration.

The connecting means can be bonding wires, conducting track, a conducting adhesive, a liquid, or/and any other means or combination of these means.

The card body is made, for example, of plastic material in particular PET, PC, PVC or any other well-known material.

The invention claimed is:

1. A card like object, comprising:
   a top face and a bottom face;
   a contactless chip;
   a contact chip; and
   an antenna electrically connected to the contactless chip,
   wherein a cavity is formed on the top face; and
   wherein the contactless chip and the contact chip are located in the cavity.

2. The card like object of claim 1, wherein the antenna is connected to the contactless chip with a conductive track.

3. The card like object of claim 1, wherein the antenna is connected to the contactless chip with a conductive adhesive.

4. The card like object of claim 1, wherein the antenna is connected to the contactless chip with a metallic wire.

5. The card like object of claim 1, wherein the antenna is connected to the contactless chip with a liquid.

6. The card like object of claim 1, wherein the contact chip and the contactless chip are in a stacked configuration.

7. The card like object of claim 1, wherein the contact chip and the contactless chip are in a side-by-side configuration.

8. The card like object of claim 1, wherein the top face is at least partially graphically personalized.

9. The card like object of claim 1, wherein the antenna is embedded within the card like object.

* * * * *